United States Patent
Liu et al.

(10) Patent No.: US 11,851,761 B2
(45) Date of Patent: Dec. 26, 2023

(54) SEMICONDUCTOR PROCESSING TOOL

(71) Applicant: Taiwan Semiconductor Manufacturing Company, Ltd., Hsinchu (TW)

(72) Inventors: Yung-Tsun Liu, Taipei (TW); Kuang-Wei Cheng, Hsinchu (TW); Sheng-chun Yang, Tainan (TW); Chih-Tsung Lee, Hsinchu (TW); Chyi-Tsong Ni, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 433 days.

(21) Appl. No.: 17/301,877

(22) Filed: Apr. 16, 2021

(65) Prior Publication Data

US 2022/0333240 A1 Oct. 20, 2022

(51) Int. Cl.
| | |
|---|---|
| *C23C 16/458* | (2006.01) |
| *B25B 11/00* | (2006.01) |
| *C23C 14/50* | (2006.01) |
| *H01L 21/67* | (2006.01) |
| *H01L 21/683* | (2006.01) |

(52) U.S. Cl.
CPC ........ *C23C 16/4586* (2013.01); *B25B 11/005* (2013.01); *C23C 14/50* (2013.01); *H01L 21/67011* (2013.01); *H01L 21/67017* (2013.01); *H01L 21/6719* (2013.01); *H01L 21/6838* (2013.01)

(58) Field of Classification Search
CPC ... C23C 16/4586; C23C 14/50; B25B 11/005; H01L 21/67017; H01L 21/6719; H01L 21/6838; H01L 21/67011
USPC ............ 137/14; 156/345.24, 345.15, 345.26; 118/715
See application file for complete search history.

(56) References Cited

U.S. PATENT DOCUMENTS

| | | | | |
|---|---|---|---|---|
| 5,191,218 | A * | 3/1993 | Mori | G03F 7/707 269/21 |
| 5,374,829 | A * | 12/1994 | Sakamoto | H01L 21/6838 269/21 |
| 6,464,790 | B1 * | 10/2002 | Sherstinsky | H01L 21/6838 269/21 |
| 2003/0141673 | A1 * | 7/2003 | Olgado | H01L 21/6838 269/21 |
| 2005/0035514 | A1 * | 2/2005 | Hillman | H01L 21/6838 269/21 |
| 2010/0048032 | A1 * | 2/2010 | Sangam | C23C 16/45544 438/785 |
| 2015/0069723 | A1 * | 3/2015 | Wang | B23B 31/307 279/3 |
| 2017/0076915 | A1 * | 3/2017 | Boyd, Jr. | H01L 21/6833 |
| 2017/0294325 | A1 * | 10/2017 | Hunter | H01L 21/67017 |

(Continued)

*Primary Examiner* — Minh Q Le
(74) *Attorney, Agent, or Firm* — Harrity & Harrity, LLP (57) ABSTRACT

A chuck vacuum line of a semiconductor processing tool includes a first portion that penetrates a sidewall of a main pumping line of the semiconductor processing tool. The chuck vacuum line includes a second portion that is substantially parallel to the sidewall of the main pumping line and to a direction of flow in the main pumping line. A size of the second portion increases between an inlet end of the second portion and an outlet end of the second portion along the direction of flow in the main pumping line.

20 Claims, 7 Drawing Sheets

(56) References Cited

U.S. PATENT DOCUMENTS

| | | | | |
|---|---|---|---|---|
| 2019/0326114 A1* | 10/2019 | Kachian | ............ | H01L 21/02639 |
| 2019/0326120 A1* | 10/2019 | Jian | .................... | H01L 21/67248 |
| 2021/0130949 A1* | 5/2021 | Min | .................... | H01L 21/6831 |
| 2021/0317579 A1* | 10/2021 | Matsunaga | .......... | C23C 16/4412 |
| 2022/0037169 A1* | 2/2022 | Yang | ................. | H01J 37/32807 |
| 2022/0199373 A1* | 6/2022 | Parimi | .............. | H01J 37/32715 |

\* cited by examiner

SEMICONDUCTOR PROCESSING TOOL

BACKGROUND

A semiconductor processing tool, such as a chemical vapor deposition (CVD) tool, may include a process chamber in which a semiconductor device (e.g., a wafer) is processed using one or more types of process gasses. The semiconductor device may be secured in place in the chamber by a chuck.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor processing tool may include a chamber in which a semiconductor device (e.g., a wafer) is processed using one or more types of process gasses. The semiconductor processing tool may include a vacuum chuck to secure the semiconductor device in place in the chamber during processing of the semiconductor device. A vacuum chuck is a type of chuck that secures a semiconductor device through the use of a vacuum. The vacuum chuck may be connected to one or more plumbing fixtures (e.g., tubes, pipes, valves, and/or the like) through which air is sucked from the chamber via one or more openings in the vacuum chuck to create an air pressure differential in the chamber. The air pressure differential includes a negative air pressure below the semiconductor device and a positive air pressure above the semiconductor device. The air pressure differential causes the semiconductor device to be forced against the vacuum chuck as the positive air pressure and the negative air pressure attempt to equalize in the chamber.

Through extended operation of the vacuum chuck, the plumbing fixtures may become increasingly lined with processing byproducts (e.g., polysilicon, silicon dioxide, and/or the like) that are pulled through the vacuum chuck. Buildup of these processing byproducts reduces and/or restricts airflow through the vacuum chuck and/or the plumbing fixtures, which decreases an effectiveness of the vacuum chuck to secure semiconductor devices in place. As a result, the semiconductor processing tool may need to be taken offline for maintenance to clean out the processing byproduct buildup, which decreases a productivity of the semiconductor processing tool.

According to some implementations described herein, an improved chuck vacuum line may reduce or prevent buildup of processing byproduct in a main pumping line of a semiconductor processing tool (e.g., as compared to a related arrangement of a chuck vacuum line). For example, the semiconductor processing tool may include a chuck provided within a process chamber body and a chuck vacuum line connected to the chuck and to apply a vacuum to the chuck to retain a semiconductor device against the chuck. Here, the improved chuck vacuum line includes a first portion and a second portion. The first portion penetrates a sidewall of the main pumping line. The second portion is within the main pumping line and is substantially parallel to the sidewall of the main pumping line and to a direction of flow in the main pumping line. A size of the second portion of the chuck vacuum line increases between an inlet end of the second portion of the chuck vacuum line (e.g., an end of the second portion that is connected to an end of the first portion) and an outlet end of the second portion chuck vacuum line (e.g., an output end of the chuck vacuum line) along the direction of flow in the main pumping line. Additional detail regarding the improved chuck vacuum line is described below.

In this way, one or more aspects of the improved chuck vacuum line may prevent buildup of processing byproducts in the main pumping line of the semiconductor processing tool. For example, the improved chuck vacuum line allows the process gas to flow in a manner that reduces or prevents buildup of processing byproduct on the interior walls of the main pumping line. Additionally, the parallel arrangement of the second portion of the chuck vacuum line does not reduce the flow of the process gas in the flow direction through the main pumping line, which prevents buildup of processing byproducts on the interior walls of the main pumping line. This keeps the main pumping line and the chuck vacuum line from becoming clogged, which increases an effectiveness of the vacuum chuck at securing semiconductor devices in place during processing. Further, because the improved chuck vacuum line prevents and/or reduces buildup of processing byproducts, the semiconductor processing tool may be taken offline less frequently for maintenance of the main pumping line and/or the chuck vacuum line, which increases the productivity of the semiconductor processing tool.

Additionally, the improved chuck vacuum line can improve performance of the semiconductor processing tool. For example, the vacuum applied via the chuck vacuum line can serve to regulate temperature within the process chamber body of the semiconductor processing tool. Here, the flow improvements enabled by the improved chuck vacuum line (e.g., due to the reduction in buildup of processing byproducts) enables improved temperature control within the process chamber body. This improved temperature control in turn improves uniformity for processing semiconductor devices (e.g., uniformity of a thickness or some other characteristic of, for example, a thin film applied to the semiconductor device by the semiconductor processing tool), meaning that a wafer range of the semiconductor processing tool is improved.

Figure 1A:
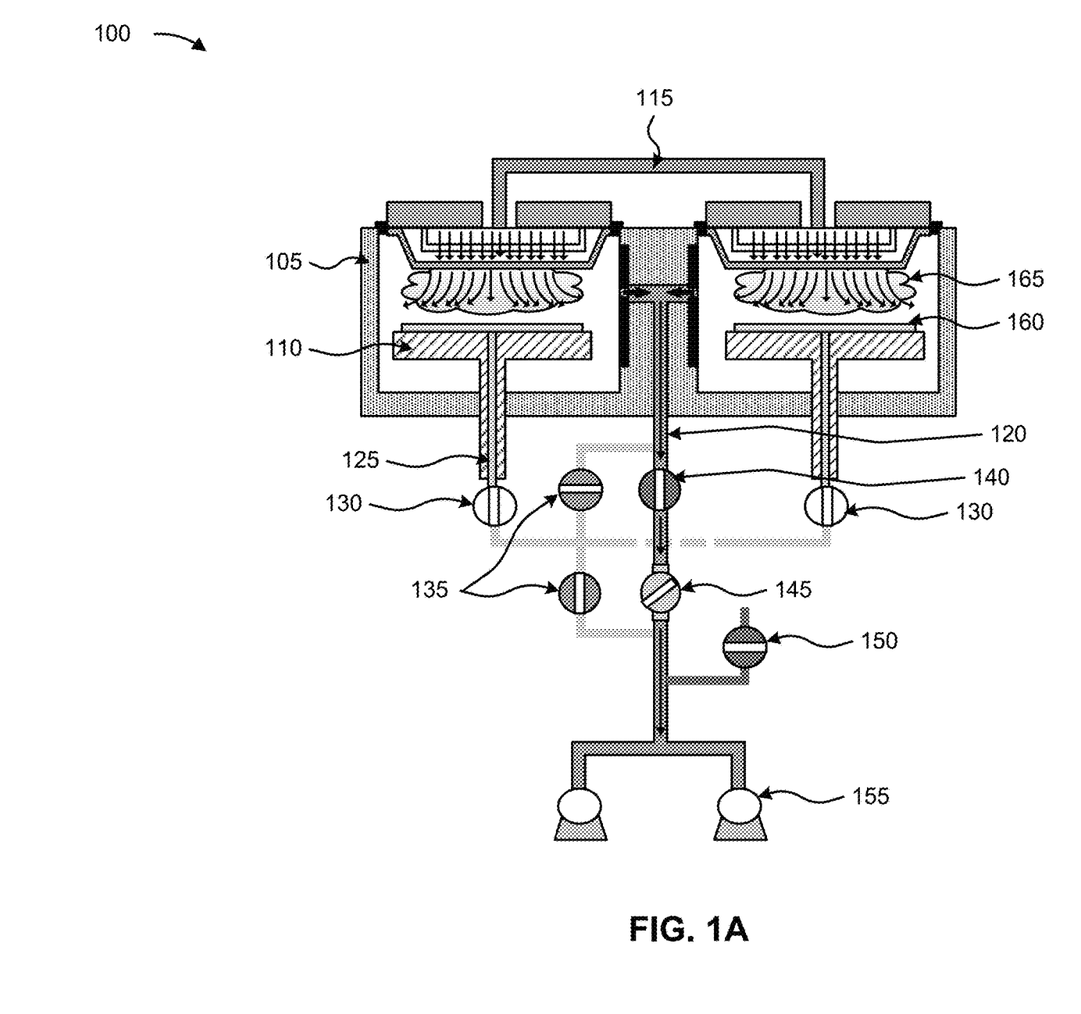
FIGS. 1A and 1B are diagrams of an example implementation of a semiconductor processing tool described herein.
Figure 1B:
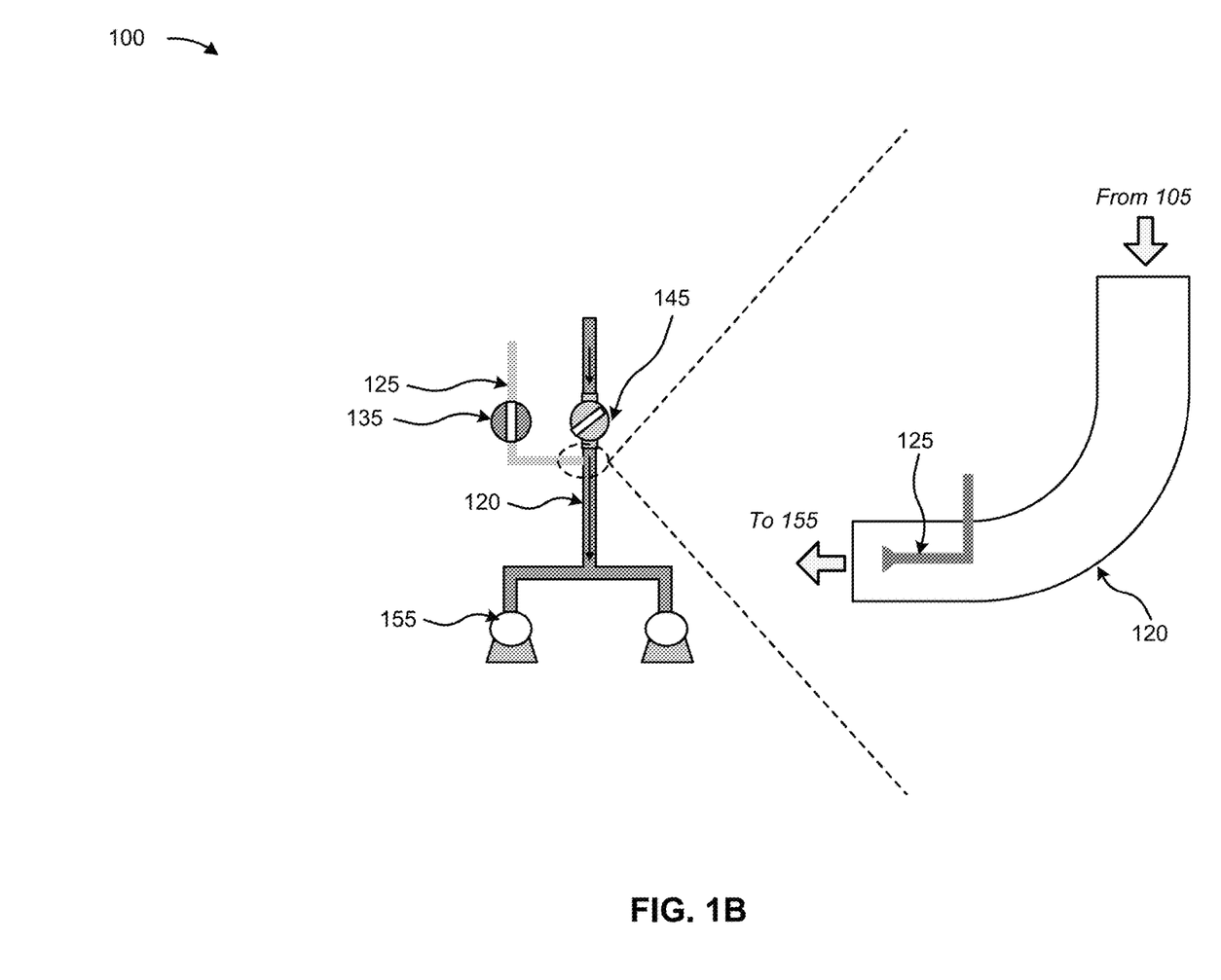

FIGS. 1A and 1B are diagrams of a semiconductor processing tool 100 described herein. In some implementations, semiconductor processing tool 100 may include a CVD tool. Additionally, or alternatively, semiconductor processing tool 100 may include another type of semiconductor processing tool, such as a physical vapor deposition (PVD) tool, a rapid thermal anneal (RTA) tool, a decoupled plasma nitridation (DPN) tool, an atomic layer deposition (ALD) tool, or an etching tool, among other examples. As shown in FIG. 1A, semiconductor processing tool 100 may include two process chamber bodies 105, two vacuum chucks 110, a process gas inlet line 115, a main pumping line 120, two chuck vacuum lines 125, two chuck valves 130, two chuck bypass valves 135, an isolation valve 140, a throttle valve 145, a ballast valve 150, and two pumps 155. The description to follow will describe an implementation of a semiconductor processing tool 100 that includes two process chamber bodies 105, two vacuum chucks 110, a single process gas inlet line 115, a single main pumping line 120, two chuck vacuum lines 125, two chuck valves 130, two chuck bypass valves 135, a single isolation valve 140, a single throttle valve 145, a single ballast valve 150, and two pumps 155. In practice, semiconductor processing tool 100 may include additional or fewer process chamber bodies 105, vacuum chucks 110, process gas inlet lines 115, main pumping lines 120, chuck vacuum lines 125, chuck valves 130, chuck bypass valves 135, isolation valves 140, throttle valves 145, ballast valves 150, and/or pumps 155.

Process chamber body 105 may include a housing that defines a process chamber for processing a semiconductor device 160 (e.g., a wafer) based on a function of semiconductor processing tool 100. For example, the process chamber may be a CVD process chamber, a PVD process chamber, an RTA process chamber, a DPN process chamber, an ALD chamber, or an etching process chamber, among other examples. Process chamber body 105 may be maintained at a pressure while semiconductor device 160 is being processed. For example, a pressure within process chamber body 105 may be maintained at less than approximately one atmosphere when semiconductor device 160 is being processed. Process chamber body 105 may be sized and shaped to house vacuum chuck 110, components associated with process gas inlet line 115, semiconductor device 160, and/or the like. Process chamber body 105 may be cylindrical in shape to aid in processing semiconductor device 160, but may be other shapes, such as box-shaped, spherical, and/or the like. In some implementations, process chamber body 105 is constructed of a material or materials that are resistant to abrasion and/or corrosion caused by process gases, semiconductor processes, pressures, temperatures, and/or the like associated with semiconductor processing tool 100. For example, process chamber body 105 may be constructed of stainless steel, aluminum, and/or the like. In some implementations, process chamber body 105 includes walls with thicknesses that provide a rigid structure capable of withstanding the semiconductor processes, the pressures, the temperatures, and/or the like associated with the semiconductor processing tool.

Vacuum chuck 110 may be provided within process chamber body 105 and may be sized and shaped to support and secure semiconductor device 160 during processing by semiconductor processing tool 100. For example, vacuum chuck 110 may be circular shaped and may support all or a portion of a circular-shaped semiconductor device. Vacuum chuck 110 may secure semiconductor device 160 through the use of a vacuum. Vacuum chuck 110 may be connected to one or more plumbing fixtures (e.g., chuck vacuum line 125) through which air is sucked from process chamber body 105 via one or more openings in vacuum chuck 110 to create an air pressure differential in process chamber body 105. The air pressure differential includes a negative air pressure below semiconductor device 160 and a positive air pressure above semiconductor device 160. The air pressure differential causes semiconductor device 160 to be forced against vacuum chuck 110 as the positive air pressure and the negative air pressure attempt to equalize in process chamber body 105. In some implementations, vacuum chuck 110 is constructed of a material or materials that are resistant to abrasion and/or corrosion caused by process gases, semiconductor processes, pressures, temperatures, and/or the like associated with semiconductor processing tool 100. For example, vacuum chuck 110 may be constructed of stainless steel, aluminum, plated aluminum (e.g., gold plated or nickel plated), and/or the like. In some implementations, vacuum chuck 110 includes a surface friction that retains semiconductor device 160 on a surface of vacuum chuck 110.

Process gas inlet line 115 may include one or more plumbing fixtures (e.g., tubes, pipes, valves, and/or the like) through which a process gas 165 is provided into process chamber body 105. Process gas 165 may include a gas utilized to process semiconductor device 160 based on a function of semiconductor processing tool 100. For example, process gas 165 may include silicon gas, argon, nitrogen, and/or the like. In some implementations, process gas inlet line 115 connects to both process chamber bodies 105 so that process gas 165 can be delivered into process chamber bodies 105. Process gas inlet line 115 may couple with one or more mechanisms that evenly disperse process gas 165 into process chamber bodies 105 and onto semiconductor devices 160 (e.g., as shown by the clouds of process gas 165 illustrated in FIG. 1A). Process gas inlet line 115 may be sized and shaped to provide a quantity of process gas 165 to process chamber bodies 105 so that semiconductor processing tool 100 may process semiconductor devices 160. In some implementations, process gas inlet line 115 is constructed of a material or materials that are resistant to corrosion or damage caused by process gas 165, a pressure associated with process gas 165, and/or the like. For example, process gas inlet line 115 may be constructed of polyvinyl chloride (PVC), chlorinated PVC (CPVC), polyvinylidene difluoride (PVDF), polypropylene, polyethylene, and/or the like.

Main pumping line 120 may include one or more plumbing fixtures (e.g., tubes, pipes, valves, and/or the like) through which process gas 165 is removed from process chamber bodies 105 during or after processing of semiconductor devices 160. Main pumping line 120 may connect to pump 155 and pump 155 may suck process gas 165 and processing byproducts from process chamber bodies 105 via main pumping line 120. Main pumping line 120 may be sized and shaped to remove process gas 165 from the process chamber bodies 105 in a manner that permits semiconductor processing tool 100 to process semiconductor devices 160. In some implementations, main pumping line 120 is constructed of a material or materials that are resistant to corrosion or damage caused by process gas 165, the pressure associated with process gas 165, and/or the like. For example, main pumping line 120 may be constructed of PVC, CPVC, PVDF, polypropylene, polyethylene, and/or the like. Further details of main pumping line 120 are provided below in connection with FIGS. 1B and 2A-2C.

Chuck vacuum line 125 may include one or more plumbing fixtures (e.g., tubes, pipes, valves, and/or the like) through which air is sucked from process chamber body 105 via one or more openings in vacuum chuck 110 to create an air pressure differential in process chamber body 105. The air pressure differential includes a negative air pressure below semiconductor device 160 and a positive air pressure above semiconductor device 160. The air pressure differential causes semiconductor device 160 to be forced against vacuum chuck 110 as the positive air pressure and the negative air pressure attempt to equalize in process chamber body 105. In some implementations, chuck vacuum line 125 connects to main pumping line 120, and the air is sucked through chuck vacuum line 125 via pump 155 sucking process gas 165 and processing byproducts from process chamber bodies 105 via main pumping line 120. In some implementations, chuck vacuum line 125 is constructed of a material or materials that are resistant to corrosion or damage caused by process gas 165, the air pressure differential, and/or the like. For example, chuck vacuum line 125 may be constructed of PVC, CPVC, PVDF, polypropylene, polyethylene, and/or the like. Further details of chuck vacuum line 125 are provided below in connection with FIGS. 1B and 2A-2E.

Chuck valve 130 may include a device that regulates, directs, or controls a flow of a fluid (e.g., a gas) by opening, closing, or partially obstructing various passageways. For example, chuck valve 130 may connect to chuck vacuum line 125 and may control a level of a vacuum (e.g., the negative air pressure below semiconductor device 160) applied to vacuum chuck 110 by pump 155 via chuck vacuum line 125. In some implementations, chuck valve 130 is constructed of a material or materials that are resistant to corrosion or damage caused by process gas 165, the air pressure differential, and/or the like. For example, one or more components of chuck valve 130 may be constructed of steel, aluminum, PVC, CPVC, PVDF, polypropylene, polyethylene, and/or the like.

Chuck bypass valve 135 may include a device that regulates, directs, or controls a flow of a fluid (e.g., a gas) by opening, closing, or partially obstructing various passageways. For example, chuck bypass valve 135 may connect to chuck vacuum line 125 and may control whether chuck vacuum line 125 connects to main pumping line 120 at a first location (e.g., upstream of isolation valve 140 and throttle valve 145) or a second location (e.g., downstream of throttle valve 145). In some implementations, chuck bypass valve 135 is constructed of a material or materials that are resistant to corrosion or damage caused by process gas 165, the air pressure differential, and/or the like. For example, one or more components of chuck bypass valve 135 may be constructed of steel, aluminum, PVC, CPVC, PVDF, polypropylene, polyethylene, and/or the like.

Isolation valve 140 may include a device that regulates, directs, or controls a flow of a fluid (e.g., a gas) by opening, closing, or partially obstructing various passageways. For example, isolation valve 140 may connect to main pumping line 120 and may stop the flow of process gas 165 through main pumping line 120 (e.g., for maintenance purposes, safety purposes, and/or the like). In some implementations, isolation valve 140 is constructed of a material or materials that are resistant to corrosion or damage caused by process gas 165, the air pressure differential, and/or the like. For example, one or more components of isolation valve 140 may be constructed of steel, aluminum, PVC, CPVC, PVDF, polypropylene, polyethylene, and/or the like.

Throttle valve 145 may include a device that regulates, directs, or controls a flow of a fluid (e.g., a gas) by opening, closing, or partially obstructing various passageways. For example, throttle valve 145 may connect to main pumping line 120 and may control a level of a vacuum applied to main pumping line 120 by pump 155. In some implementations, throttle valve 145 is constructed of a material or materials that are resistant to corrosion or damage caused by process gas 165, the air pressure differential, and/or the like. For example, one or more components of throttle valve 145 may be constructed of steel, aluminum, PVC, CPVC, PVDF, polypropylene, polyethylene, and/or the like.

Ballast valve 150 may include a device that regulates, directs, or controls a flow of a fluid (e.g., a gas) by opening, closing, or partially obstructing various passageways. For example, ballast valve 150 may connect to main pumping line 120 and may regulate whether pump 155 is capable of attaining a highest vacuum level achievable by pump 155. In some implementations, ballast valve 150 is constructed of a material or materials that are resistant to corrosion or damage caused by process gas 165, the air pressure differential, and/or the like. For example, one or more components of ballast valve 150 may be constructed of steel, aluminum, PVC, CPVC, PVDF, polypropylene, polyethylene, and/or the like.

Pump 155 may include a device that removes a fluid (e.g., a gas) from a sealed volume in order to achieve a partial vacuum. For example, pump 155 may connect to main pumping line 120, and may remove process gas 165, the processing byproduct, and/or the like from main pumping line 120. In some implementations, pump 155 may have a working pressure of, for example, 350 pascals (Pa). In some implementations, pump 155 may have a working pressure greater or less than 350 pascals (Pa). In some implementations, pump 155 is constructed of a material or materials that are resistant to corrosion or damage caused by process gas 165, the air pressure differential, and/or the like. For example, one or more components of pump 155 may be constructed of steel, aluminum, PVC, CPVC, PVDF, polypropylene, polyethylene, and/or the like. In some implementations, semiconductor processing tool 100 may include a controller (not shown) that controls (e.g., opens, closes, partially opens, partially closes, and/or the like) chuck valves 130, chuck bypass valves 135, isolation valves 140, throttle valves 145, and/or ballast valves 150, and that controls (e.g., turns on or off) pumps 155.

In some implementations, as shown to the left in FIG. 1B, chuck vacuum line 125 may connect to main pumping line 120 downstream from throttle valve 145. Alternatively, or additionally, chuck vacuum line 125 may connect to main pumping line 120 upstream of isolation valve 140 and throttle valve 145. As shown to the right in FIG. 1B, a portion of chuck vacuum line 125 may be provided within main pumping line 120. Additional details regarding the arrangement of chuck vacuum line 125 with respect to main pumping line 120 are provided below with respect to FIGS. 2A-2E.

As indicated above, FIGS. 1A and 1B are provided merely as one or more examples. Other examples may differ from what is described with regard to FIGS. 1A and 1B.

Figure 2A:
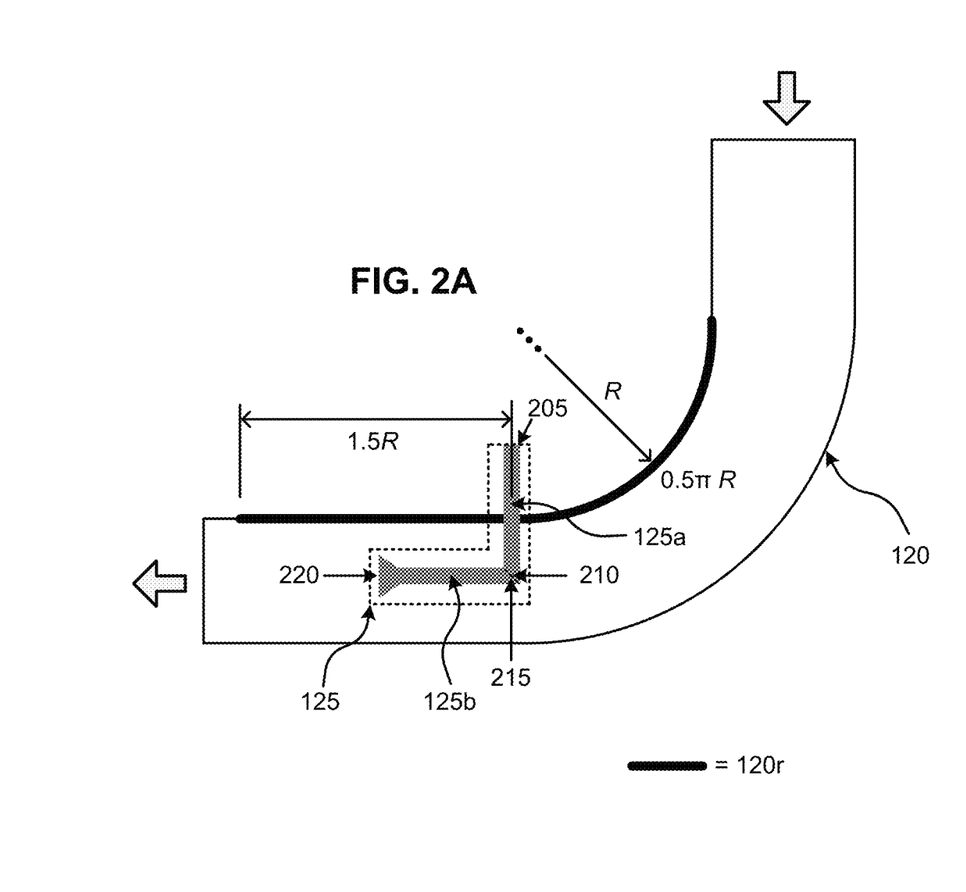
FIGS. 2A-2E are diagrams of an example implementation of a chuck vacuum line of the semiconductor processing tool of FIGS. 1A and 1B.

FIGS. 2A-2E are diagrams of an example implementation of chuck vacuum line 125 of semiconductor processing tool 100. FIG. 2A provides a view of an arrangement of chuck vacuum line 125 with respect to main pumping line 120. As shown, a first portion 125a of chuck vacuum line 125 may be provided external to main pumping line 120 and a second portion 125b of chuck vacuum line 125 may be provided internally within main pumping line 120. An inlet end 205 of the first portion 125a may include a chuck vacuum line inlet that connects to and receives fluid (e.g., process gas, air, and/or the like) via one or more openings provided in vacuum chuck 110 (not shown). An outlet end 210 of the first portion 125a is coupled to an inlet end 215 of the second portion 125b. An outlet end 220 of the second portion 125b may provide the fluid from chuck vacuum line 125 to main pumping line 120. Thus, the fluid may flow from inlet end 205 through the first portion 125a and the second portion 125b, and may exit chuck vacuum line 125 through outlet end 220. In some implementations, as shown in FIG. 2A, first portion 125a and second portion 125b are integrally attached such that an angle is formed between first portion 125a and second portion 125b. The angle may be, for example, a 90 degree angle (as shown in FIG. 2A), or an angle that is greater than 90 degrees, such as a 135 degree angle, among other examples.

Figure 2B:
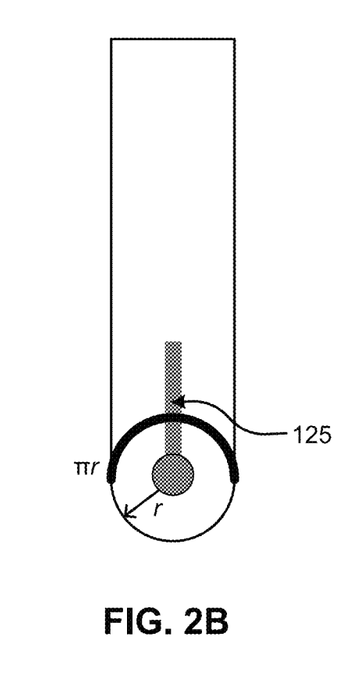

In some implementations, as shown in FIGS. 2A and 2B, first portion 125a of chuck vacuum line 125 penetrates a sidewall of main pumping line 120 at a bend area 120r of main pumping line 120. In some implementations, bend area 120r is an area between an upstream end of a bend in main pumping line 120 and a location along main pumping line 120 that is approximately 1.5×R from a downstream end of the bend, where R is a radius of the bend in main pumping line 120. Thus, in some implementations, as shown in FIG. 2A, bend area 120r may have a total length of approximately $(1.5 \times R)+(0.5 \times \pi \times R)$. In some implementations, bend area 120r may be on an interior side of a bend in main pumping line 120. Thus, in some implementations, as shown in FIG. 2B, bend area 120r may have a width of approximately $\pi \times r$, where r is a radius of main pumping line 120. Notably, processing byproducts tend to accumulate at or near bend area 120r of main pumping line 120 (i.e., the bend of main pumping line 120 is a "hotspot" for accumulation of processing byproducts). Therefore, installation of chuck vacuum line 125 at or near bend area 120r may be utilized to improve flow at or near bend area 120r, thereby reducing or preventing accumulation of processing byproducts within main pumping line 120 at or near bend area 120r.

In some implementations, as illustrated in FIG. 2A, second portion 125b of chuck vacuum line 125 is substantially parallel to the sidewall of main pumping line 120 and to a direction of flow in main pumping line 120. The parallel arrangement of second portion 125b relative to main pumping line 120 does not reduce the flow of fluid in the flow direction through main pumping line 120. Thus, the parallel arrangement reduces or prevents buildup of processing byproducts on interior walls of main pumping line 120.

In some implementations, as illustrated in FIGS. 2A and 2B, second portion 125b of chuck vacuum line 125 is substantially centered within main pumping line 120. That is, in some implementations, second portion 125b is arranged at a center of main pumping line 120 (e.g., such that a longitudinal axis of second portion 125b lies on a longitudinal axis of the portion of main pumping line 120 in which second portion 125b is installed). The arrangement of second portion 125b at the center of main pumping line 120 improves uniformity of the flow of fluid in the flow direction through main pumping line 120. Thus, the arrangement of second portion 125b at the center of main pumping line 120 reduces or prevents buildup of processing byproducts on interior walls of main pumping line 120 that would otherwise be caused by a non-uniform flow of fluid.

In some implementations, as illustrated in FIGS. 2A and 2B, first portion 125a of chuck vacuum line 125 penetrates main pumping line 120 at an angle of approximately 90 degrees. In some implementations, penetration of first portion 125a into main pumping line 120 at a 90-degree angle simplifies installation of chuck vacuum line 125 within main pumping line 120. Thus, the perpendicular arrangement of first portion 125a relative to the sidewall of main pumping line 120 may reduce complexity associated with setting up or configuring semiconductor processing tool 100.

In some implementations, as illustrated in FIG. 2A, a size of outlet end 220 of second portion 125b is larger than a size of inlet end 215 of second portion 125b. That is, a size of second portion 125b may increase between inlet end 215 of second portion 125b and outlet end 220 of second portion 125b along the direction of flow in main pumping line 120. For example, in some implementations, second portion 125b of chuck vacuum line 125 has a horn-like shape at outlet end 220. In some implementations, the horn-like shape of second portion 125b at outlet end 220 improves a flow of fluid around chuck vacuum line 125 within main pumping line 120, which reduces a likelihood of accumulation of processing byproducts in main pumping line 120 in a region around chuck vacuum line 125.

Figure 2C:
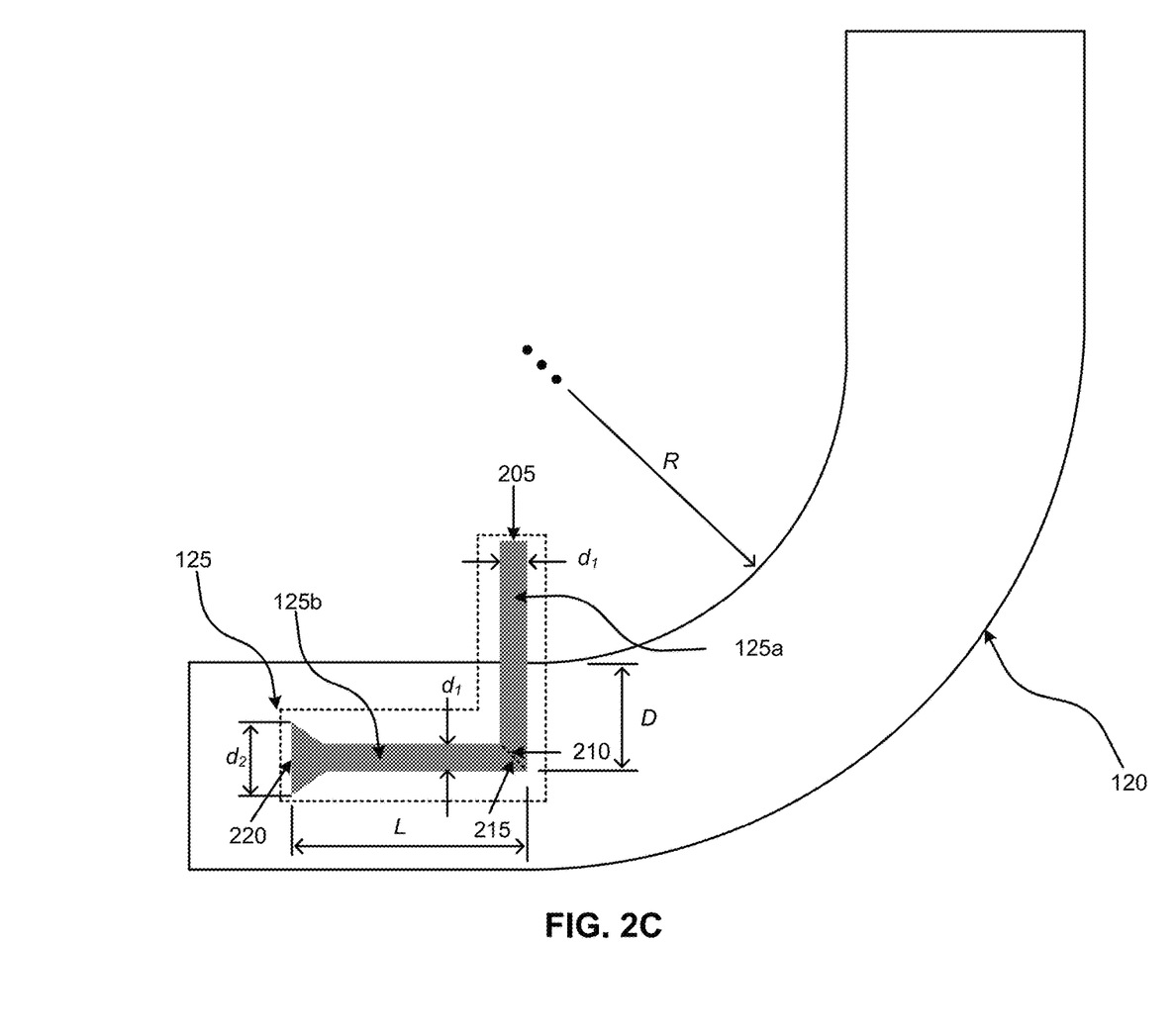

FIG. 2C is a diagram with further illustration of sizes and dimensions of an example chuck vacuum line 125 having a horn-like shape at outlet end 220 of second portion 125b. As shown in FIG. 2C, in some implementations, first portion 125a of chuck vacuum line 125 may have a size (e.g., a diameter) $d_1$. That is, a size of first portion 125a from inlet end 205 to outlet end 210 may have the size $d_1$. As further shown, in some implementations, a section of second portion 125b may have the size $d_1$. For example, a section of second portion 125b starting approximately at inlet end 215 (e.g., coupled to outlet end 210 of first portion 125a) and ending at the horn-like portion of second portion 125b may have the size $d_1$. The size of first portion 125a near outlet end 210 and/or the size of second portion 125b near inlet end 215 may vary slightly in order to facilitate the coupling of first portion 125a and second portion 125b.

As further shown, the size of second portion 125b may increase along a length of another section of second portion 125b such that second portion 125b has a size $d_2$ at outlet end 220. In some implementations, as illustrated in FIG. 2C, the size of second portion 125b increases in a region at or near the outlet end of second portion 125b only (while a majority of second portion 125b has size $d_1$). Alternatively, in some implementations, the size of second portion 125b increases along a substantial portion of the length (e.g., the entire length, a majority of the length) of second portion 125b.

In some implementations, the size of second portion 125b may increase at a constant rate along the region of size increase (e.g., such that the horn-like portion is not curved). Alternatively, in some implementations, the size of second portion 125b may increase at a non-constant rate (e.g., a parabolic rate, an exponential rate, or the like) along the region of size increase (e.g., such that the horn-like portion is curved).

In some implementations, a ratio of the size of second portion 125b at outlet end 220 to the size of second portion 125b at inlet end 215 is in a range from approximately 1.12 to approximately 1.95. That is, in some implementations, a ratio of the size $d_2$ to the size $d_1$ may be in a range from approximately 1.12 to approximately 1.95. Put another way, the size of outlet end 220 of second portion 125b (e.g., the size $d_2$) may be, in some implementations, approximately 1.12 to approximately 1.95 times larger than the size of inlet end 215 of second portion 125b (e.g., the size $d_1$). In some implementations, a size $d_2$ to size $d_1$ ratio of less than 1.12 may degrade performance in terms of reducing or prevent accumulation of processing byproducts (e.g., as compared to a larger ratio). Further, a size $d_2$ to size $d_1$ ratio that is greater than 1.95 does not provide a significant improvement in performance in reduction or prevention of accumulation of processing byproducts and may in some cases inhibit flow of fluid in main pumping line 120 (e.g., as the size $d_2$ increases relative to the size $d_1$). Thus, the size $d_2$ to size $d_1$ ratio being in the range from approximately 1.12 to approximately 1.95 may be used to ensure adequate performance for reduction in buildup without impacting a flow of fluid within main pumping line 120.

In practice, chuck vacuum line 125 may be sized and shaped with particular dimensions. The particular dimensions may be dependent upon a size of main pumping line 120, which may depend on a size of the semiconductor processing tool 100. Thus, the following dimensions are only example dimensions and, in practice, chuck vacuum line 125 may include different dimensions, greater dimensions, lesser dimensions, and/or the like. For example, the size $d_1$ may be in a range from approximately 5.2 mm to approximately 8.9 mm. As another example, the size $d_2$ may be in a range from approximately 5.8 mm to approximately 17.4 mm. As still another example, a length L of second portion 125b (identified in FIG. 2C) may be in a range from approximately 4.6 centimeters (cm) to approximately 15.0 cm. In some implementations, the length L is selected such that second portion 125b is long enough to permit first portion 125a to penetrate main pumping line 120 at the end of the bend in main pumping line 120 and/or such that maintenance of chuck vacuum line 125 is simplified (e.g., such that chuck vacuum line 125 can be readily removed for maintenance or replacement). As another example, a depth D (identified in FIG. 2C) at which first portion 125a penetrates main pumping line 120 may be in a range from approximately 0.5 cm to approximately 1.6 cm. In some implementations, the depth D is selected such that second portion 125b is centered within main pumping line 120, as described above.

Figure 2D:
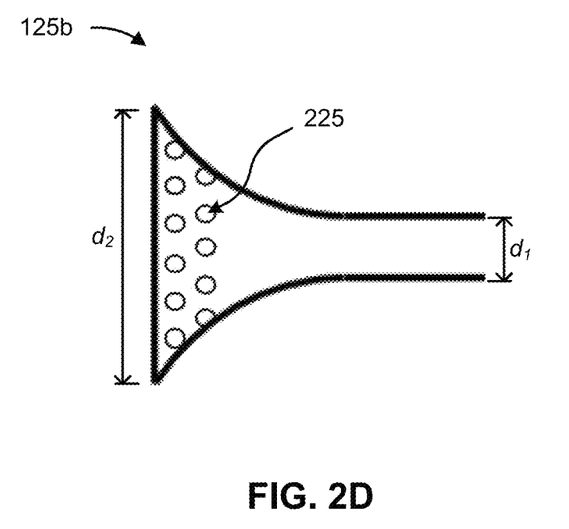
Figure 2E:
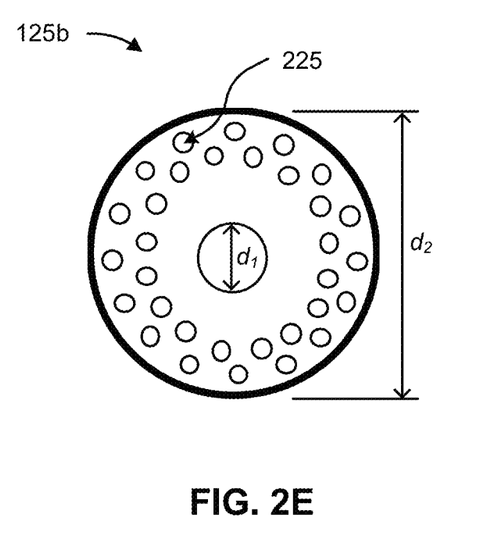

In some implementations, second portion 125b includes a plurality of openings 225 at or near outlet end 220. FIGS. 2D and 2E are diagrams illustrating an example arrangement of openings 225 at or near outlet end 220 of second portion 125b of chuck vacuum line 125. In some implementations, openings 225 change distribution of the flow of fluid within main pumping line 120 and therefore reduce a likelihood of processing byproducts concentrating near outlet end 220 of second portion 125b of chuck vacuum line 125. In some implementations, the plurality of openings are symmetrically arranged about a center of a plane corresponding to outlet end 220 of second portion 125b and/or are distributed around the region at or near outlet end 220. In some implementations, a symmetric arrangement and/or distribution of openings 225 serves to provide a uniform flow around outlet end 220 of second portion 125b, thereby reducing a likelihood of processing byproducts concentrating near outlet end 220 of second portion 125b within main pumping line 120. In some implementations, the plurality of openings 225 form at least two rings (e.g., concentric rings) at or near outlet end 220 of second portion 125b on sidewalls of second portion 125b. In some implementations, a distance between a given pair of rings may be, for example, approximately 1 millimeter. In some implementations, arrangement of openings 225 in rings serves to provide a uniform flow around outlet end 220 of second portion 125b, thereby reducing a likelihood of processing byproducts concentrating near outlet end 220 of second portion 125b within main pumping line 120.

In practice, chuck vacuum line 125 may be designed with a size $d_1$, a size $d_2$, a length L, a depth D, and/or a shape at outlet end 220 that can reduce or prevent buildup of processing byproducts in main pumping line 120 and/or that can improve performance of vacuum chuck 110. For example, a vacuum chuck pipe pressure simulation analysis and design of experiment (DOE) can be used as to optimize the design of chuck vacuum line 125, and the design can be experimentally verified.

As indicated above, FIGS. 2A-2E are provided merely as one or more examples. Other examples may differ from what is described with regard to FIGS. 2A-2E.

Figure 3:
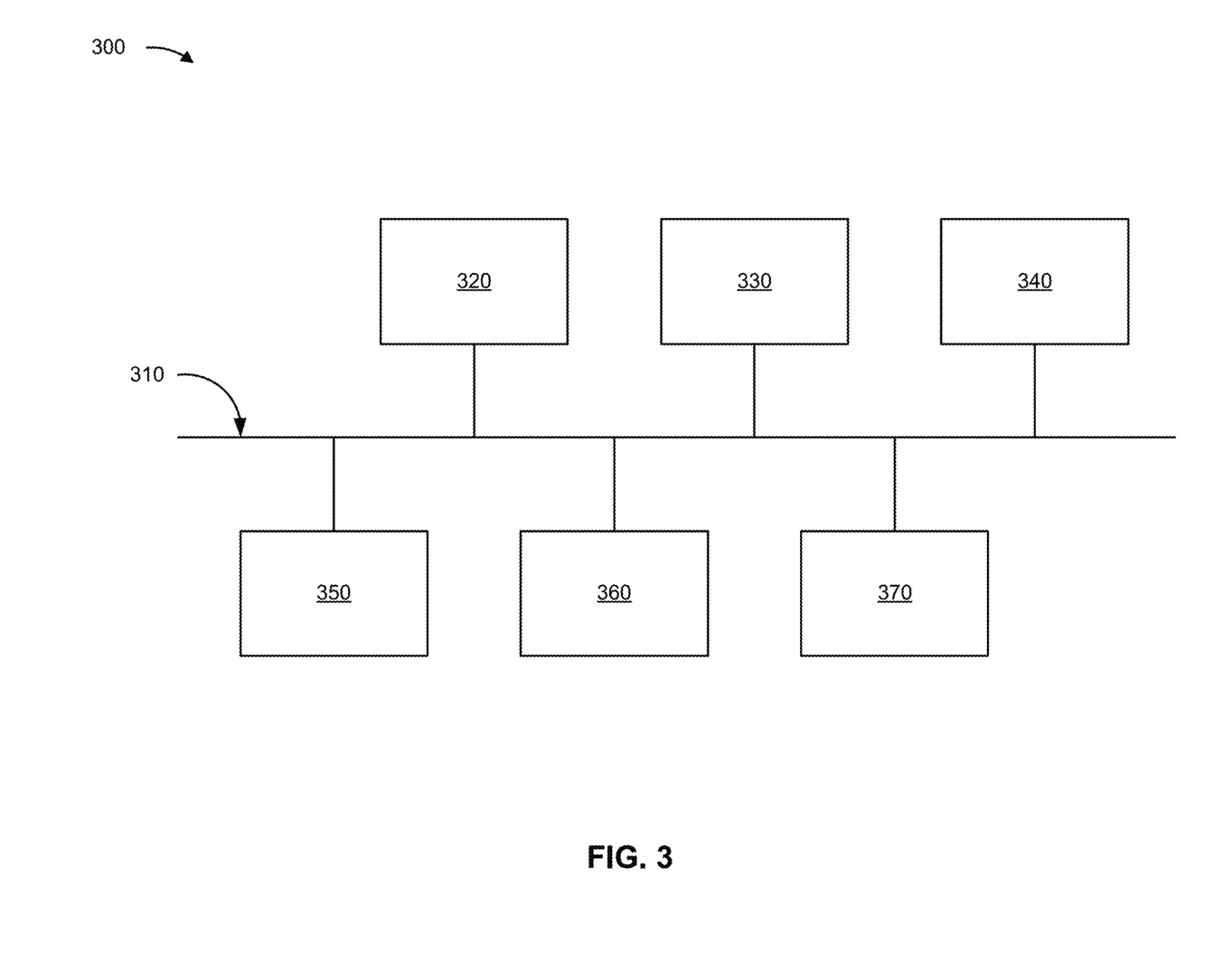
FIG. 3 is a diagram of example components of the semiconductor processing tool of FIGS. 1A and 1B.

FIG. 3 is a diagram of example components of a device 300, which may correspond to one or more components of semiconductor processing tool 100. In some implementations, semiconductor processing tool 100 may include one or more devices 300 and/or one or more components of device 300. As shown in FIG. 3, device 300 may include a bus 310, a processor 320, a memory 330, a storage component 340, an input component 350, an output component 360, and a communication component 370.

Bus 310 includes a component that enables wired and/or wireless communication among the components of device 300. Processor 320 includes a central processing unit, a graphics processing unit, a microprocessor, a controller, a microcontroller, a digital signal processor, a field-programmable gate array, an application-specific integrated circuit, and/or another type of processing component. Processor 320 is implemented in hardware, firmware, or a combination of hardware and software. In some implementations, processor 320 includes one or more processors capable of being programmed to perform a function. Memory 330 includes a random access memory, a read only memory, and/or another type of memory (e.g., a flash memory, a magnetic memory, and/or an optical memory).

Storage component 340 stores information and/or software related to the operation of device 300. For example, storage component 340 may include a hard disk drive, a magnetic disk drive, an optical disk drive, a solid state disk drive, a compact disc, a digital versatile disc, and/or another type of non-transitory computer-readable medium. Input component 350 enables device 300 to receive input, such as user input and/or sensed inputs. For example, input component 350 may include a touch screen, a keyboard, a keypad, a mouse, a button, a microphone, a switch, a sensor, a global positioning system component, an accelerometer, a gyroscope, and/or an actuator. Output component 360 enables device 300 to provide output, such as via a display, a speaker, and/or one or more light-emitting diodes. Communication component 370 enables device 300 to communicate with other devices, such as via a wired connection and/or a wireless connection. For example, communication component 370 may include a receiver, a transmitter, a transceiver, a modem, a network interface card, and/or an antenna.

Device 300 may perform one or more processes described herein. For example, a non-transitory computer-readable medium (e.g., memory 330 and/or storage component 340) may store a set of instructions (e.g., one or more instructions, code, software code, and/or program code) for execution by processor 320. Processor 320 may execute the set of instructions to perform one or more processes described herein. In some implementations, execution of the set of instructions, by one or more processors 320, causes the one or more processors 320 and/or the device 300 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
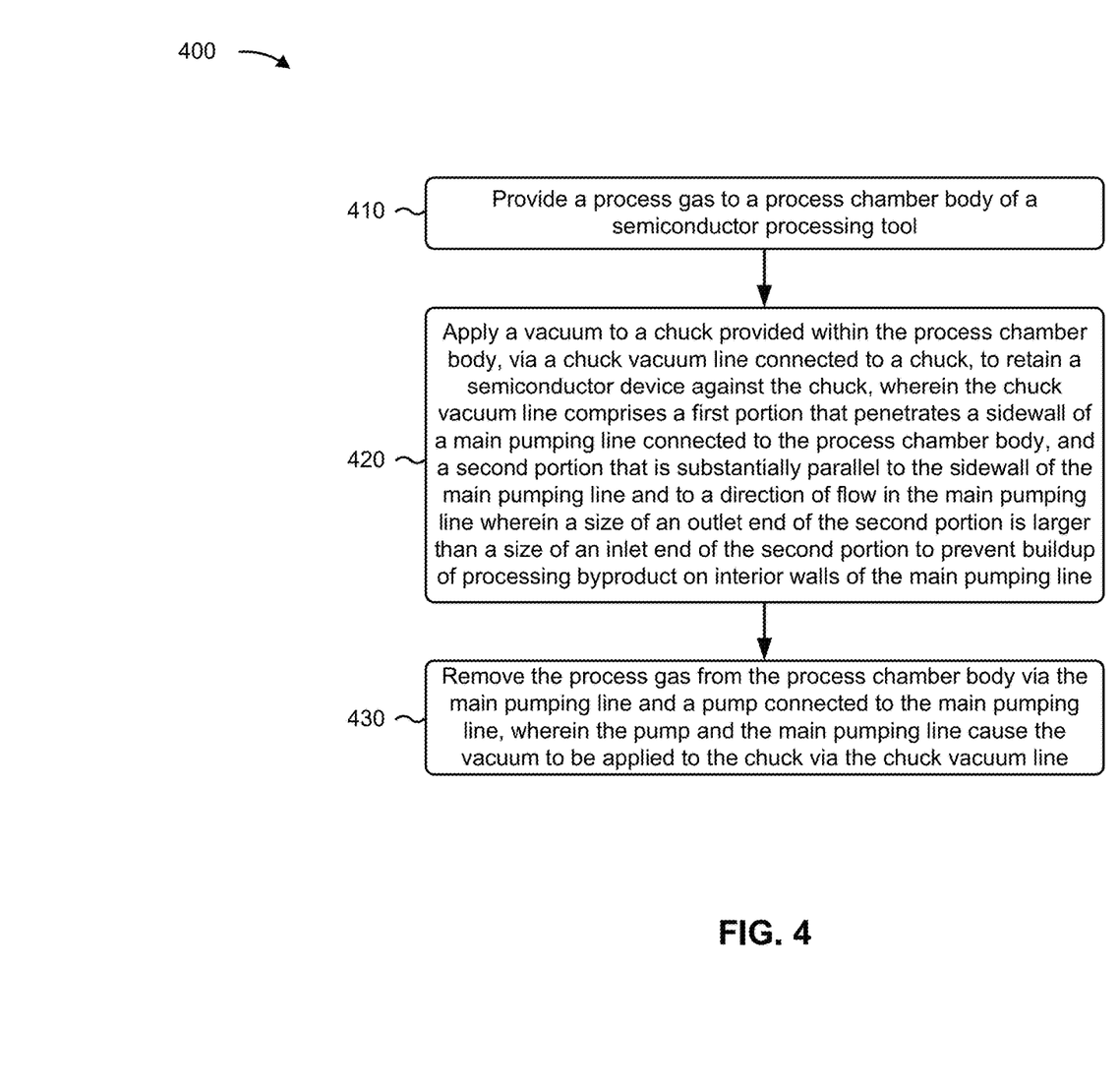
FIG. 4 is a flowchart of an example process of using the semiconductor processing tool described herein.

FIG. 4 is a flowchart of an example process 400 associated with using semiconductor processing tool 100. In some implementations, one or more process blocks of FIG. 4 may be performed by a semiconductor processing tool (e.g., semiconductor processing tool 100). Additionally, or alternatively, one or more process blocks of FIG. 4 may be performed by one or more components of device 300, such as processor 320, memory 330, storage component 340, input component 350, output component 360, and/or communication component 370.

As shown in FIG. 4, process 400 may include providing a process gas to a process chamber body of a semiconductor processing tool (block 410). For example, semiconductor processing tool 100 may provide process gas 165 to process chamber body 105 of semiconductor processing tool 100, as described above.

As further shown in FIG. 4, process 400 may include applying a vacuum to a chuck provided within the process chamber body, via a chuck vacuum line connected to the chuck, to retain a semiconductor device against the chuck, wherein the chuck vacuum line comprises a first portion that penetrates a sidewall of a main pumping line connected to the process chamber body, and a second portion that is substantially parallel to the sidewall of the main pumping line and to a direction of flow in the main pumping line, wherein a size of an outlet end of the second portion is larger than a size of an inlet end of the second portion to prevent buildup of processing byproduct on interior walls of the main pumping line (block 420). For example, semiconductor processing tool 100 may apply a vacuum to vacuum chuck 110 provided within process chamber body 105, via a chuck vacuum line 125 connected to vacuum chuck 110, to retain semiconductor device 160 against vacuum chuck 110, wherein chuck vacuum line 125 comprises first portion 125a that penetrates a sidewall of main pumping line 120 connected to process chamber body 105, and second portion 125b that is substantially parallel to the sidewall of main pumping line 120 and to a direction of flow in main pumping line 120, wherein a size of an outlet end of second portion 125b is larger than a size of an inlet end of second portion 125b to prevent buildup of processing byproduct on interior walls of main pumping line 120, as described above.

As further shown in FIG. 4, process 400 may include removing the process gas from the process chamber body via the main pumping line and a pump connected to the main pumping line, wherein the pump and the main pumping line cause the vacuum to be applied to the chuck via the chuck vacuum line (block 430). For example, semiconductor processing tool 100 may remove process gas 165 from process chamber body 105 via main pumping line 120 and pump 155 connected to main pumping line 120, wherein pump 155 and main pumping line 120 cause the vacuum to be applied to vacuum chuck 110 via chuck vacuum line 125, as described above.

Process 400 may include additional implementations, such as any single implementation or any combination of implementations described below and/or in connection with one or more other processes described elsewhere herein.

In a first implementation, second portion 125b is substantially centered within main pumping line 120.

In a second implementation, alone or in combination with the first implementation, first portion 125a penetrates main pumping line 120 at an angle of approximately 90 degrees.

In a third implementation, alone or in combination with any of the first and second implementations, bend area 120r at which first portion 125a penetrates main pumping line 120 is an area between an upstream end of a bend in main pumping line 120 and a location along main pumping line 120 that is approximately 1.5×R from a downstream end of the bend in main pumping line 120, where R is a radius of the bend in main pumping line 120.

In a fourth implementation, alone or in combination with any of the first through third implementations, a ratio of the size of the outlet end of second portion 125b to the size of the inlet end of the second portion 125b is in a range from approximately 1.12 to approximately 1.95.

In a fifth implementation, alone or in combination with any of the first and fourth implementations, second portion 125b has a horn-like shape at the outlet end of chuck vacuum line 125.

In a sixth implementation, alone or in combination with any of the first and fifth implementations, second portion 125b includes a plurality of openings 225 at or near the outlet end of second portion 125b.

In a seventh implementation, in combination with the sixth implementation, the plurality of openings 225 are symmetrically arranged about a center of a plane corresponding to the outlet end of second portion 125b.

In an eighth implementation, alone or in combination with any of the sixth and seventh implementations, the plurality of openings 225 form at least two concentric rings of openings at or near the outlet end of second portion 125b.

In a ninth implementation, alone or in combination with any of the first through eighth implementations a region at or near the outlet end of second portion 125b includes at least two rings of openings 225 to prevent processing byproduct from concentrating at or near the outlet end of second portion 125b.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

In this way, chuck vacuum line 125 may prevent buildup of processing byproducts in main pumping line 120 of semiconductor processing tool 100. For example, chuck vacuum line 125 allows process gas 165 to flow in a manner that reduces or prevents buildup of processing byproduct on the interior walls of main pumping line 120. Additionally, the parallel arrangement of second portion 125b of chuck vacuum line 125 does not reduce the flow of process gas 165 in the flow direction through main pumping line 120, which prevents buildup of processing byproducts on the interior walls of main pumping line 120. This keeps main pumping line 120 and chuck vacuum line 125 from becoming clogged, which increases an effectiveness of vacuum chuck 110 at securing semiconductor devices 160 in place during processing. Further, because chuck vacuum line 125 prevents and/or reduces buildup of processing byproducts, semiconductor processing tool 100 may be taken offline less frequently for maintenance of main pumping line 120 and/or chuck vacuum line 125, which increases the productivity of the semiconductor processing tool 100. Additionally, chuck vacuum line 125 improves performance of semiconductor processing tool 100. For example, the vacuum applied via chuck vacuum line 125 can serve to regulate temperature within process chamber body 105 of semiconductor processing tool 100. Here, the flow improvements enabled by chuck vacuum line 125 (e.g., due to the reduction in buildup of processing byproducts) enables improved temperature control within process chamber body 105. This improved temperature control in turn improves uniformity for processing semiconductor devices 160, thereby improving performance of semiconductor processing tool 100.

As described in greater detail above, some implementations described herein provide a semiconductor processing tool. The semiconductor processing tool includes a process chamber body. The semiconductor processing tool includes a gas inlet line connected to provide a process gas to the process chamber body. The semiconductor processing tool includes a chuck provided within the process chamber body to support a semiconductor device to be processed by the semiconductor processing tool. The semiconductor processing tool includes a main pumping line connected to remove the process gas from the process chamber body. The semiconductor processing tool includes a chuck vacuum line connected to the chuck to apply a vacuum to the chuck to retain the semiconductor device against the chuck, the chuck vacuum line comprising a first portion and a second portion, where the first portion penetrates a sidewall of the main pumping line at a bend area in the main pumping line, where the second portion is substantially parallel to the sidewall of the main pumping line and to a direction of flow in the main pumping line, and where a size of an outlet end of the second portion is larger than a size of an inlet end of the second portion. The semiconductor processing tool includes a pump connected to the main pumping line, to cause the process gas to be removed from the process chamber body through the main pumping line, and to cause the vacuum to be applied to the chuck via the chuck vacuum line.

As described in greater detail above, some implementations described herein provide a chuck vacuum line. The chuck vacuum line includes a first portion that penetrates a sidewall of a main pumping line, the chuck vacuum line and the main pumping line being included in a semiconductor processing tool. The chuck vacuum line includes a second portion that is substantially parallel to the sidewall of the main pumping line and to a direction of flow in the main pumping line, where a size of the second portion increases between an inlet end of the second portion and an outlet end of the second portion along the direction of flow in the main pumping line.

As described in greater detail above, some implementations described herein provide a method. The method includes providing a process gas to a process chamber body of a semiconductor processing tool. The method includes applying a vacuum to a chuck provided within the process chamber body, via a chuck vacuum line connected to the chuck, to retain a semiconductor device against the chuck, where the chuck vacuum line comprises a first portion that penetrates a sidewall of a main pumping line connected to the process chamber body, and a second portion that is substantially parallel to the sidewall of the main pumping line and to a direction of flow in the main pumping line, where a size of an outlet end of the second portion is larger than a size of an inlet end of the second portion to prevent buildup of processing byproduct on interior walls of the main pumping line. The method includes removing the process gas from the process chamber body via the main pumping line and a pump connected to the main pumping line, where the pump and the main pumping line cause the vacuum to be applied to the chuck via the chuck vacuum line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a process gas to a process chamber body of a semiconductor processing tool;
   applying a vacuum to a chuck provided within the process chamber body, via a chuck vacuum line connected to the chuck, to retain a semiconductor device against the chuck,
      wherein the chuck vacuum line comprises:
         a first portion that penetrates a sidewall of a main pumping line connected to the process chamber body, and
         a second portion that is substantially parallel to the sidewall of the main pumping line and to a direction of flow in the main pumping line,
            wherein a size of an outlet end of the second portion is larger than a size of an inlet end of the second portion to prevent buildup of processing byproduct on interior walls of the main pumping line; and
   removing the process gas from the process chamber body via the main pumping line and a pump connected to the main pumping line,
      wherein the pump and the main pumping line cause the vacuum to be applied to the chuck via the chuck vacuum line.

2. The method of claim 1, wherein the first portion penetrates the main pumping line at a bend area of the main pumping line, the bend area being an area between an upstream end of a bend in the main pumping line and a location along the main pumping line that is approximately 1.5×R from a downstream end of the bend in the main pumping line, wherein R is a radius of the bend in the main pumping line.

3. The method of claim 1, wherein the second portion of the chuck vacuum line is substantially centered within the main pumping line.

4. The method of claim 1, wherein the first portion of the chuck vacuum line penetrates the main pumping line at an angle of approximately 90 degrees.

5. The method of claim 1, wherein a ratio of the size of the outlet end of the second portion to the size of the inlet end of the second portion is in a range from approximately 1.12 to approximately 1.95.

6. The method of claim 1, wherein the second portion of the chuck vacuum line has a horn-like shape at the outlet end of the chuck vacuum line.

7. The method of claim 1, wherein the second portion includes a plurality of openings at or near the outlet end of the second portion.

8. The method of claim 7, wherein the plurality of openings are symmetrically arranged about a center of a plane corresponding to the outlet end of the second portion.

9. The method of claim 7, wherein the plurality of openings form at least two concentric rings of openings at or near the outlet end of the second portion.

10. A chuck vacuum line, comprising:
a first portion that penetrates a sidewall of a main pumping line, the chuck vacuum line and the main pumping line being included in a semiconductor processing tool; and
a second portion that is substantially parallel to the sidewall of the main pumping line and to a direction of flow in the main pumping line,
wherein a size of the second portion increases between an inlet end of the second portion and an outlet end of the second portion along the direction of flow in the main pumping line.

11. The chuck vacuum line of claim 10, wherein the size of the outlet end of the second portion is approximately 1.12 to approximately 1.95 times larger than the size of the inlet end of the second portion.

12. The chuck vacuum line of claim 10, wherein the second portion of the chuck vacuum line has a horn-like shape at the outlet end of the chuck vacuum line.

13. The chuck vacuum line of claim 10, wherein the size of the second portion increases in a region at or near the outlet end of the second portion only.

14. The chuck vacuum line of claim 10, wherein a region at or near the outlet end of the second portion includes a plurality of openings.

15. The semiconductor processing tool of claim 14, wherein the plurality of openings are distributed around the region at or near the outlet end of the second portion.

16. The semiconductor processing tool of claim 14, wherein the plurality of openings form at least two rings on sidewalls of the second portion.

17. The chuck vacuum line of claim 10, wherein the second portion of the chuck vacuum line is arranged at a center of the main pumping line.

18. The chuck vacuum line of claim 10, wherein the first portion penetrates the main pumping line in an area between an upstream end of a bend in the main pumping line and a location along the main pumping line that is approximately 1.5×R from a downstream end of the bend in the main pumping line, wherein R is a radius of the bend in the main pumping line.

19. A semiconductor processing tool, comprising:
a process chamber body;
a gas inlet line connected to provide a process gas to the process chamber body;
a chuck provided within the process chamber body to support a semiconductor device to be processed by the semiconductor processing tool;
a main pumping line connected to remove the process gas from the process chamber body;
a chuck vacuum line connected to the chuck to apply a vacuum to the chuck to retain the semiconductor device against the chuck, the chuck vacuum line comprising a first portion and a second portion,
wherein the first portion penetrates a sidewall of the main pumping line at a bend area in the main pumping line,
wherein the second portion is substantially parallel to the sidewall of the main pumping line and to a direction of flow in the main pumping line, and
wherein a size of an outlet end of the second portion is larger than a size of an inlet end of the second portion; and
a pump connected to the main pumping line, to cause the process gas to be removed from the process chamber body through the main pumping line, and to cause the vacuum to be applied to the chuck via the chuck vacuum line.

20. The semiconductor processing tool of claim 19, wherein a region at or near the outlet end of the second portion includes at least two rings of openings to prevent processing byproduct from concentrating at or near the outlet end of the second portion.

* * * * *